United States Patent
Kherani et al.

(10) Patent No.: US 8,938,239 B2
(45) Date of Patent: Jan. 20, 2015

(54) WIRELESS COMMUNICATION DEVICE CAPABLE OF EFFICIENT HANDOFFS

(75) Inventors: Arzad Alam Kherani, Bangalore (IN); Soumen Chakraborty, Bangalore (IN); Erik Stauffer, Mountain View, CA (US); Manish Airy, Bangalore (IN); Rishi Ranjan, Foster City, CA (US); Phani Kiran Boddapati, Bangalore (IN); C. Ashok Kumar Reddy, Bangalore (IN)

(73) Assignee: Broadcom Corporation, Irvine, CA (US)

( * ) Notice: Subject to any disclaimer, the term of this patent is extended or adjusted under 35 U.S.C. 154(b) by 90 days.

(21) Appl. No.: 13/340,384

(22) Filed: Dec. 29, 2011

(65) Prior Publication Data

US 2013/0130694 A1 May 23, 2013

Related U.S. Application Data

(60) Provisional application No. 61/562,196, filed on Nov. 21, 2011.

(51) Int. Cl.
 *H04W 36/00* (2009.01)
 *H04W 24/00* (2009.01)
 *H04W 28/02* (2009.01)
 *H04L 12/24* (2006.01)

(52) U.S. Cl.
 CPC ....... *H04W 28/0263* (2013.01); *H04L 41/0803* (2013.01); *Y02B 60/50* (2013.01)
 USPC ...................................... 455/436; 455/456.1

(58) Field of Classification Search
 USPC ........ 455/436–444, 456.1–457; 370/329–333
 See application file for complete search history.

(56) References Cited

U.S. PATENT DOCUMENTS

| | | | |
|---|---|---|---|
| 6,173,181 B1 * | 1/2001 | Losh | 455/434 |
| 7,167,707 B1 * | 1/2007 | Gazzard et al. | 455/434 |
| 2002/0025811 A1 * | 2/2002 | Willey | 455/434 |
| 2002/0193135 A1 * | 12/2002 | Nakano | 455/524 |
| 2004/0203839 A1 * | 10/2004 | Ostberg et al. | 455/455 |
| 2006/0183477 A1 * | 8/2006 | Bocking et al. | 455/435.2 |
| 2007/0127416 A1 * | 6/2007 | Terasawa et al. | 370/331 |
| 2009/0291686 A1 * | 11/2009 | Alpert et al. | 455/436 |
| 2010/0027507 A1 * | 2/2010 | Li et al. | 370/331 |
| 2010/0069070 A1 * | 3/2010 | Shi et al. | 455/436 |

* cited by examiner

*Primary Examiner* — Daniel Lai
(74) *Attorney, Agent, or Firm* — Sterne, Kessler, Goldstein & Fox PLLC

(57) ABSTRACT

A wireless communication device is disclosed that is capable of performing efficient handoffs in order to maximize connection time with either a serving or target base station. The wireless communication device performs measurements of only intra-frequency base stations to avoid retuning its radio module. Based on this information, as well as stored information relating to nearby base stations, the serving base station is able to estimate a position of the wireless communication device and compare the estimated position to positions of the known base stations in order to make a handoff decision. In addition, by storing information during measurement or handoff preparation, the device is capable of skipping handoff steps, immediately return to the serving base station after handoff failure, and/or perform streamlined PLMN searching.

16 Claims, 10 Drawing Sheets

WIRELESS COMMUNICATION DEVICE CAPABLE OF EFFICIENT HANDOFFS

CROSS-REFERENCE TO RELATED APPLICATIONS

This patent application claims the benefit of U.S. Provisional Patent Application No. 61/562,196, filed Nov. 21, 2011, entitled "Fourth Generation (4G) Communication System."

BACKGROUND

1. Field of Invention

The invention relates to wireless communications, and more specifically to a wireless communication device that is capable of efficiently measuring a secondary radio access technology.

2. Related Art

Wireless communication devices, such as cellular telephones to provide an example, are becoming commonplace in both personal and commercial settings. The wireless communication devices provide users with access to all kinds of information, as well as the ability to communicate with other such devices across large distances. For example, a user can access the internet through an internee browser on the device, download miniature applications (e.g., "apps") from a digital marketplace, send and receive emails, or make telephone calls using a voice over internet protocol (VoIP). Consequently, wireless communication devices provide users with significant mobility, while allowing them to remain "connected" to communication channels and information.

Wireless communication devices communicate with one or more other wireless communication devices or wireless access points to send and receive data. Typically, a first wireless communication device generates and transmits a radio frequency signal modulated with encoded information. This radio frequency signal is transmitted into a wireless environment and is received by a second wireless communication device. The second wireless communication device demodulates and decodes the received signal to obtain the information. The second wireless communication device may then respond in a similar manner. The wireless communication devices can communicate with each other or with access points using any well-known modulation scheme, including simple amplitude modulation (AM), simple frequency modulation (FM), quadrature amplitude modulation (QAM), phase shift keying (PSK), quadrature phase shift keying (QPSK), and/or orthogonal frequency-division multiplexing (OFDM), as well as any other communication scheme that is now, or will be, known.

During communication with a current base station, wireless communication devices repeatedly measure other base stations and report the measurement results to the current base station. The current base station can determine, from the measurements, whether the wireless communication device should handoff to one of the measured base stations. However, the process of measuring and handing off to other base stations is extremely cumbersome, and wastes significant amounts of communication time (and therefore decreases throughput).

In order to perform measurements, typical wireless communication devices measure all cells within range. However, because many of these cells operate on a different frequency than the current base station, the wireless communication device must retune its receiver for each differently-tuned base station. In addition, once a base station has been selected for handoff, the wireless communication device performs several time-consuming steps, including waiting for a time offset from the new base station, which could take up to 10 ms to arrive. The wireless communication device also must search for its preferred PLMN (Public Land Mobile Network), which is unorganized, and therefore can have significant negative effects on system performance.

Consequently, there is a need for a wireless communication device capable of efficiently measuring and handing off to other base stations from a current base station. Further aspects and advantages of the invention will become apparent from the detailed description that follows.

BRIEF DESCRIPTION OF THE DRAWINGS/FIGURES

Embodiments of the invention are described with reference to the accompanying drawings. In the drawings, like reference numbers indicate identical or functionally similar elements. Additionally, the left most digit(s) of a reference number identifies the drawing in which the reference number first appears.

Figure 8A:
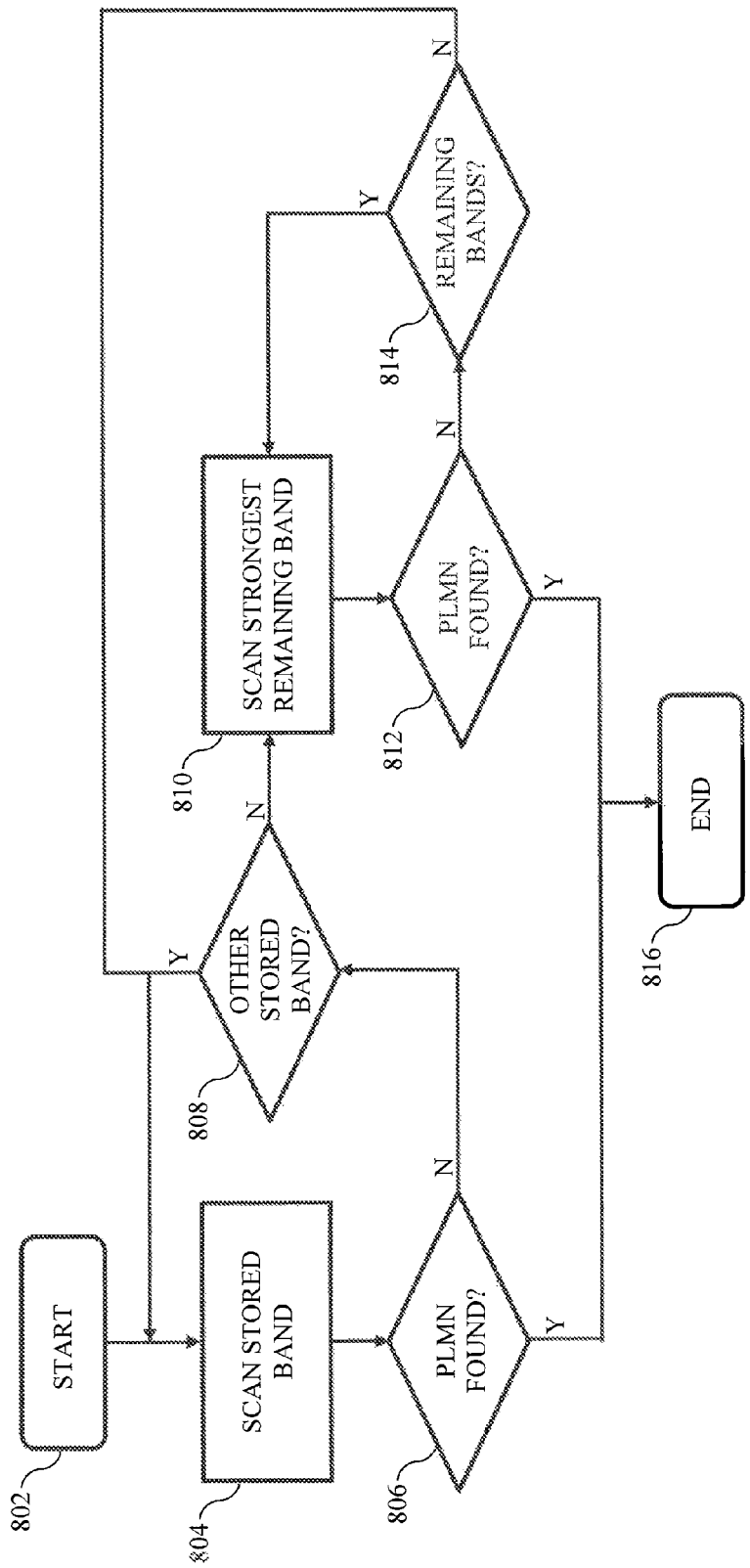
FIG. 8A illustrates a block diagram of a method for scanning frequency bands as part of a larger method of searching for a preferred PLMN that may be implemented by the wireless communication device according to an exemplary embodiment of the present invention.
Figure 8B:
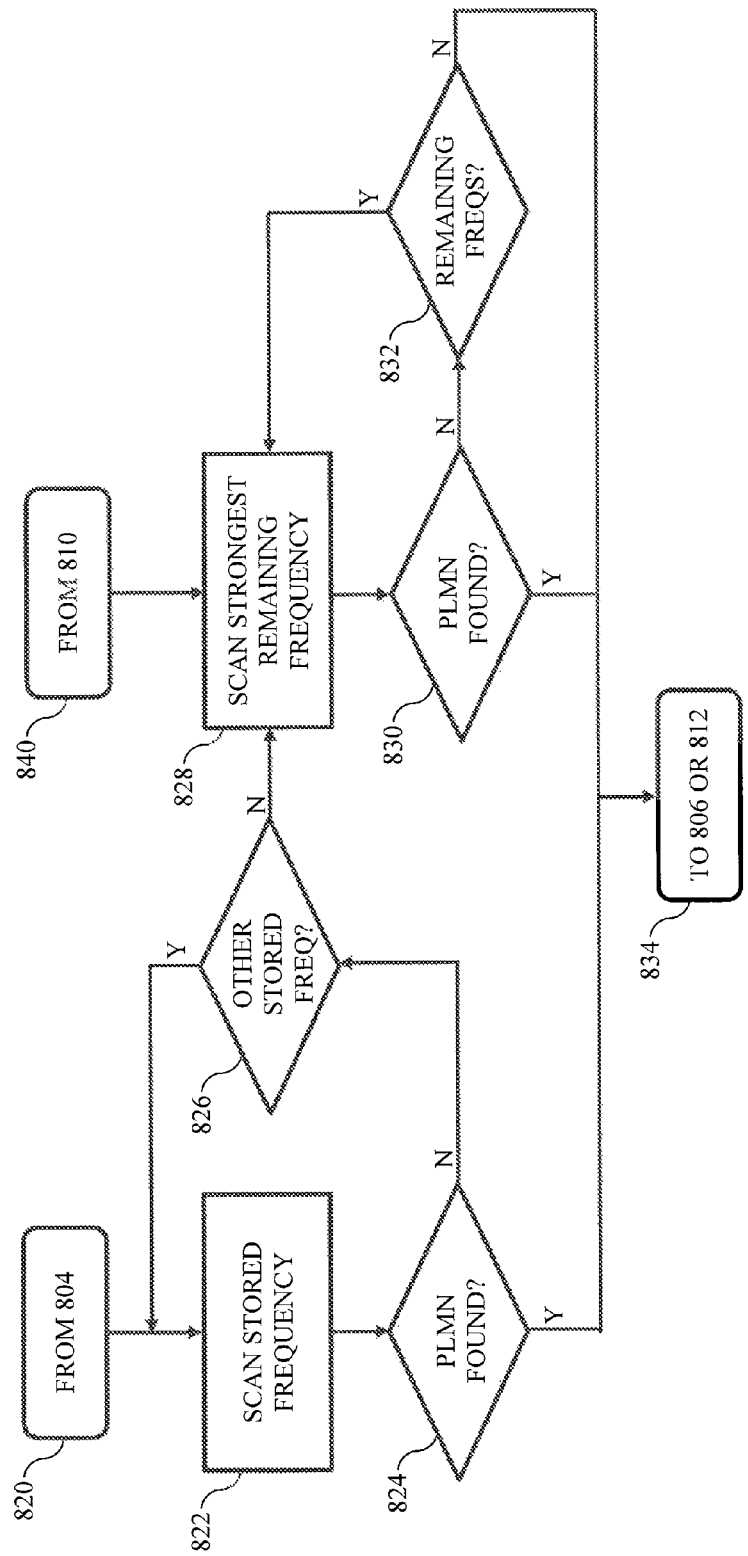
Figure 8C:
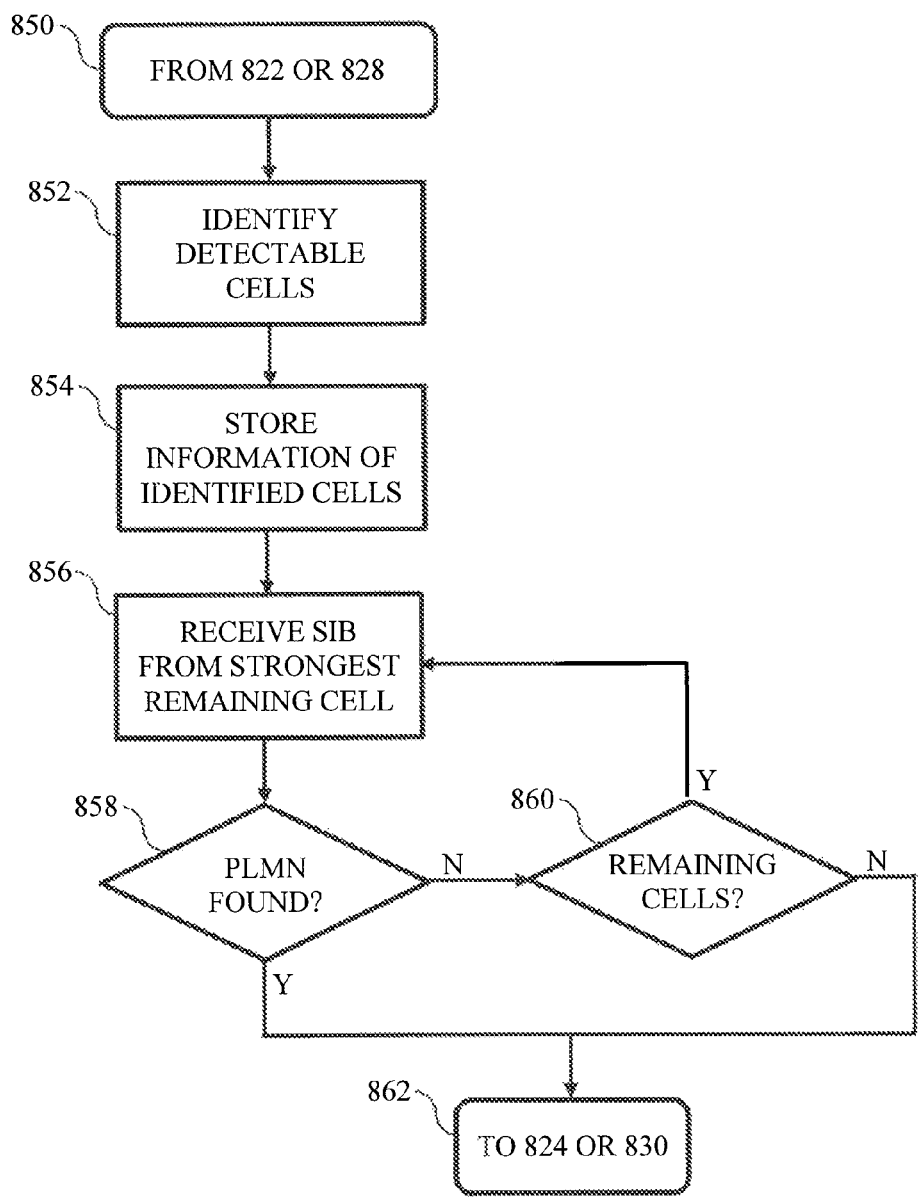

FIG. 8B illustrates a block diagram of a method for scanning frequencies within a frequency band as part of the larger method of searching for a preferred. PLMN that may be implemented by the wireless communication device according to an exemplary embodiment of the present invention; and FIG. 8C illustrates a block diagram of a method for scanning cells within a frequency as part of the larger method of searching for a preferred PLMN that may be implemented by the wireless communication device according to an exemplary embodiment of the present invention.

The invention will now be described with reference to the accompanying drawings. In the drawings, like reference numbers generally indicate identical, functionally similar,

DETAILED DESCRIPTION OF THE INVENTION

The following Detailed Description refers to accompanying drawings to illustrate exemplary embodiments consistent with the invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

Embodiments of the invention may be implemented in hardware (e.g., circuits), firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Although the description of the present invention is to be described in terms of wireless communication (specifically cellular communication), those skilled in the relevant art(s) will recognize that the present invention may be applicable to other communications that use wired or other wireless communication methods without departing from the spirit and scope of the present invention.

An Exemplary Wireless Communications Environment

Figure 1:
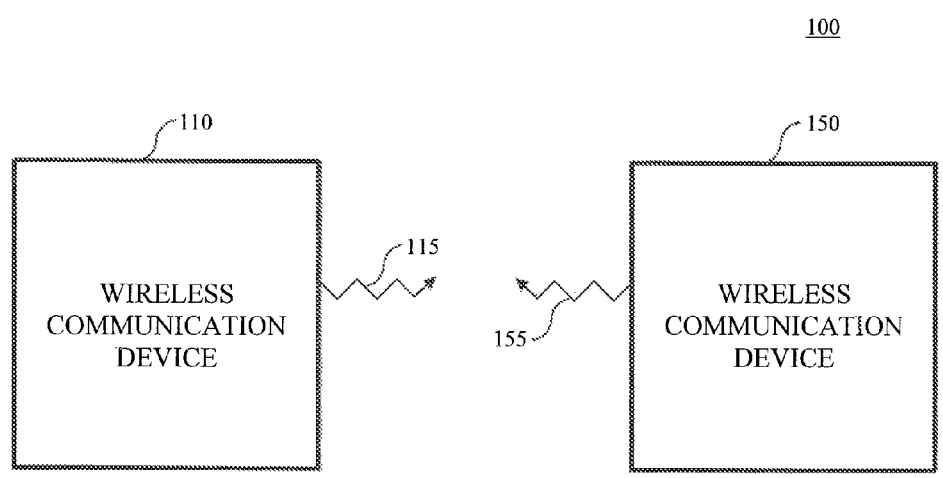
FIG. 1 illustrates a block diagram of a wireless communication environment according to an exemplary embodiment of the invention.

FIG. 1 illustrates a block diagram of a wireless communication environment 100 according to an exemplary embodiment of the invention. The wireless communication environment 100 provides wireless communication of information, such as one or more commands and/or data, between wireless communication devices. The wireless communication devices may each be implemented as a standalone or a discrete device, such as a mobile telephone, or may be incorporated within or coupled to another electrical device or host device, such as a portable computing device, a camera, or a Global Positioning System (GPS) unit or another computing device such as a personal digital assistant, a video gaming device, a laptop, a desktop computer, or a tablet, a computer peripheral such as a printer or a portable audio and/or video player to provide some examples and/or any other suitable electronic device that will be apparent to those skilled in the relevant art(s) without departing from the spirit and scope of the invention.

The exemplary wireless communication environment 100 includes a first wireless communication device 110 and a second wireless communication device 150. The first wireless communication device 110 may represent an exemplary embodiment of a user equipment and the second wireless communication device 150 may represent an exemplary embodiment of a second user equipment or a base station within a cellular communications network.

The first wireless communication device 110 transmits a first wireless signal 115 toward the second wireless communication device 150 using any acceptable modulation scheme. The second wireless communication device 150 receives the first wireless signal 115. The second wireless communication device 150 processes the received first communication signal and, if necessary, transmits a second wireless signal 155 back to the first wireless communication device 110. In this manner, the first wireless communication device 110 and the second wireless communication device 150 exchange information ("communicate") with one another.

An Exemplary Wireless Communication Device

Figure 2:
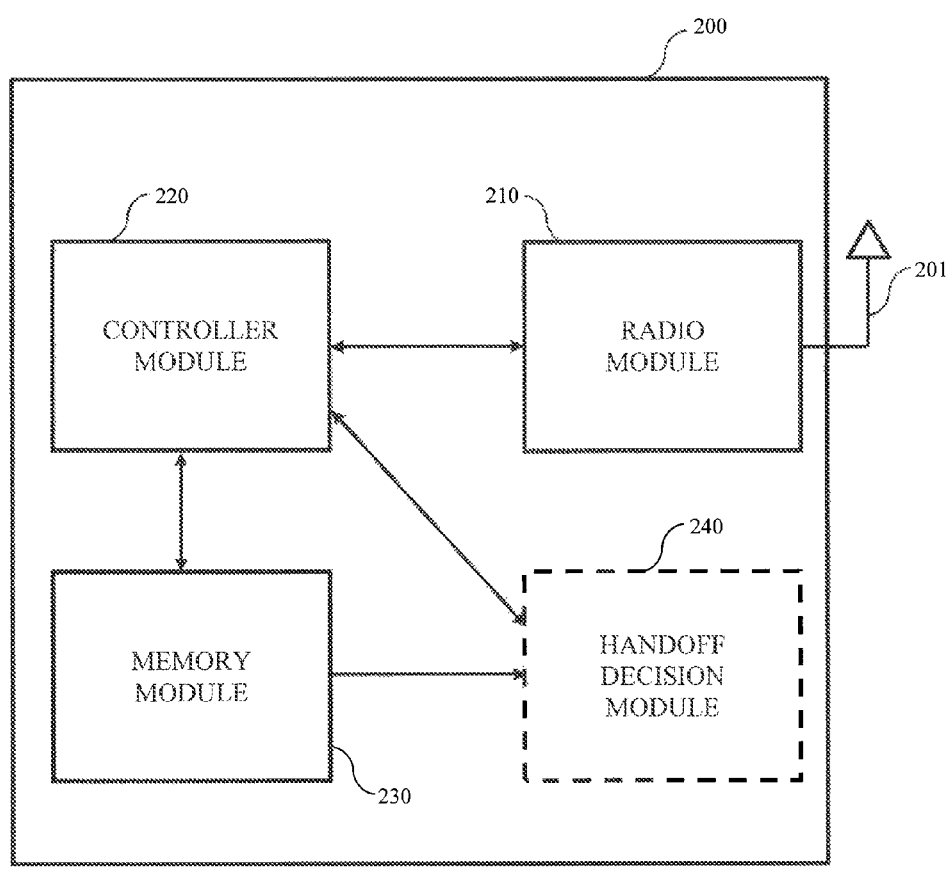
FIG. 2 illustrates a block diagram of a wireless communication device that is implemented as part of the wireless communication environment according to an exemplary embodiment of the invention.

FIG. 2 illustrates a block diagram of a wireless communication device 200 that is implemented as part of the wireless communication environment 100 according to an exemplary embodiment of the invention. The wireless communication device 200 includes a radio module 210 and a memory module 230, and may represent an exemplary embodiment of the first wireless communication device 110 or the second wireless communication device 150.

The wireless communication device 200 includes a controller module 220 that performs most of the functions within the wireless communication device 200, including background processing, signal processing, and control. The controller module 220 is connected to each of the radio module 210 and the memory module 230. The radio module 210 receives signals from, and transmits signals to, the wireless communication environment 100 via an antenna 201. The radio module 210 may include one or more receiver chains for receiving and front-end processing signals.

Upon receipt of signals from the wireless communication environment 100, the radio module 210 performs front-end processing on the received signals and forwards the received signals to the controller module 220. The front-end processing may include demodulation and decoding, among other processings. The controller module 220 may also control the operation of, and generate signals for transmission by, the radio module 210.

Occasionally, the controller module 220 controls the wireless communication device 200 to perform measurements of nearby base stations. Specifically, the controller module 220 controls the radio module 210 to receive signals from other base stations (base stations other than the current base station). Upon receipt of these signals, the radio module 210 performs front-end processings on the signals, and forwards the resulting signals to the controller module 220. The controller module 220 can perform various measurements of the other base stations based on the received signals, such as measuring receive power and/or estimating a time offset of the base stations, among others. The controller module 220 then forwards any relevant information (discussed below) to the memory module 230 for storage.

The wireless communication device 200 can also optionally include a handoff decision module 240. The handoff decision module 240 is preferably included in a base station wireless communication device, but can also be included in other wireless communication devices, such as a user equipment (UE). The controller module 220 controls the handoff decision module 240 to make a determination as to whether the UE should handoff to another base station. After receiving the instruction from the controller module 220, the handoff decision module 240 retrieves relevant information from the memory module 230 and determines whether a handoff should be initiated. The handoff decision module 240 then reports to the controller module 220 accordingly, such that the controller module 220 can initiate handoff procedures. The handoff decision module 240, and its configuration, is discussed in detail below.

Exemplary Device Configuration for Determining Whether to Handoff

Intra-Frequency Measurements

As discussed above, when measuring other base stations, typical wireless communication devices measure all nearby base stations. However, because different base stations will operate on different frequencies, typical wireless communication devices must retune their radio modules for each frequency, which can be extremely time consuming. Therefore, in the exemplary embodiment, the wireless communication device 200 measures only nearby base stations on the same frequency as the current base station (i.e., intra-frequency base stations). For purposes of this discussion, it will be presumed a user equipment (UE) performs the various operations described herein, and is represented by the wireless communication device 200 of FIG. 2.

When the controller module 220 determines that measurements are necessary, the controller module 220 controls the radio module 210 to receive signals from other nearby base stations. The controller module 220 does not, however, retune the radio module 210, but rather only causes the radio module to receive signals from intra-frequency base stations. Once received, the radio module 210 performs front-end processing on the signals and forwards the signals to the controller module 220. The controller module 220 performs various measurement operations on the received signals, including determining a base station associated with the signals, a receive power of the signals, and a time offset, among others.

Once the controller module 220 has acquired the various measurements from the received signals, the controller module 220 causes one or more of the measurements to be stored in the memory module 230 in association with the base station. The controller module 220 also forwards the measurements to the radio module 210 for transmission to the current base station Those skilled in the relevant art(s) will recognize that many modifications may be made to the above wireless communication device 200 within the spirit and scope of the present invention. For example, if the wireless communication device 200 does not detect any nearby base stations on the current frequency, the controller module 220 may retune the radio module 210 to measure alternative frequencies.

Handoff Decision-Making Based on Estimated Location

Once the current base station receives the intra-frequency measurements from the UE, the base station is able to analyze the information and determine whether the UE should perform a handoff to another base station. For purposes of this discussion, it will be presumed that the current base station performs the various operations described herein, and is represented by the wireless communication device 200 of FIG. 2.

Figure 3:
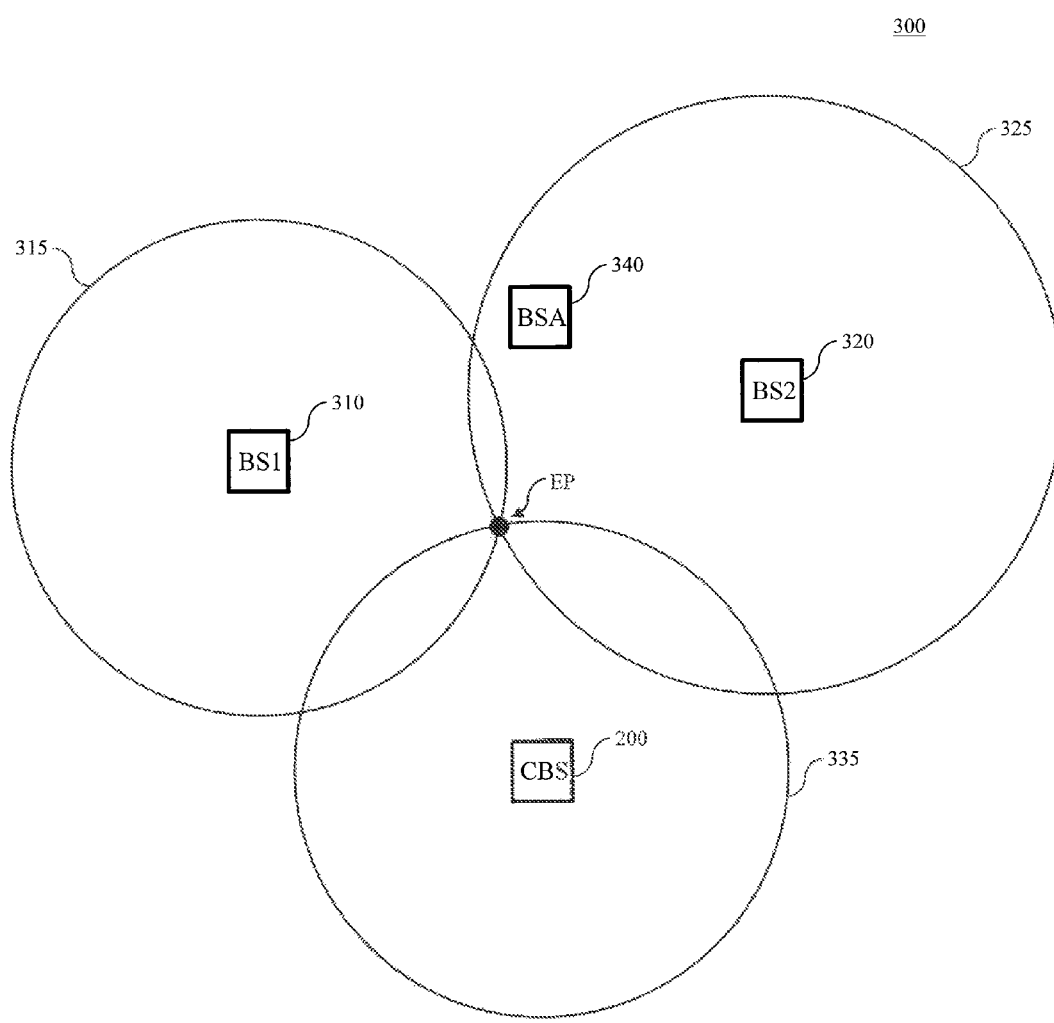
FIG. 3 illustrates a wireless communication network that may include the wireless communication device according to an exemplary embodiment of the invention.

FIG. 3 illustrates a wireless communication network 300 that includes the user equipment and the current base station 200 according to an exemplary embodiment of the invention. As shown in FIG. 3, the wireless communication network 300 includes the current base station (CBS) 200, as well as base stations (BS1) 310 and (BS2) 320 that each operate on the same frequency. The wireless communication network 300 also includes an additional base station (BSA) 340 that operates on a different frequency. For purposes of this example, because only base stations 310 and 320 are intra-frequency base stations, the current base station 200 will only receive measurement information relating to these base stations, and will not receive measurement information relating to base station 340.

Referring back to FIG. 2, the memory module 230 of the current base station 200 stores information relating to all base stations within its vicinity. For example, the memory module 230 stores locations and transmission powers of nearby base stations, as well as the communication capabilities of the nearby base stations. The nearby base stations preferably include all base stations whose communication ranges partially overlap or abut the communication range of the current base station 200, and may include inter-frequency base stations, intra-frequency base stations, pico/femto/micro cells, and base stations using the same or different RAT (radio access technology) than the current base station, among others. Therefore, in the example of FIG. 3, the memory module 230 of the current base station 200 includes information relating to each of intra-frequency base stations 310 and 320, as well as inter-frequency base station 340.

Upon receipt of the measurement signals from the UE, the radio module 210 performs front-end processings on the received signals and forwards the measurement information to the controller module 220. The controller module 220 forwards the measurement information to the handoff decision module 240 and instructs the handoff decision module 240 to make a determination as to whether the UE should perform a handoff to a nearby base station.

The handoff decision module 240 begins the determination process by estimating the location of the UE based on the intra-frequency measurement information. Specifically, the handoff decision module 240 estimates the distance of each of the measured base stations to the UE based on the receive power of the corresponding measurement signals, as illustrated in FIG. 4.

1. Estimating a Location of the UE

Figure 4:
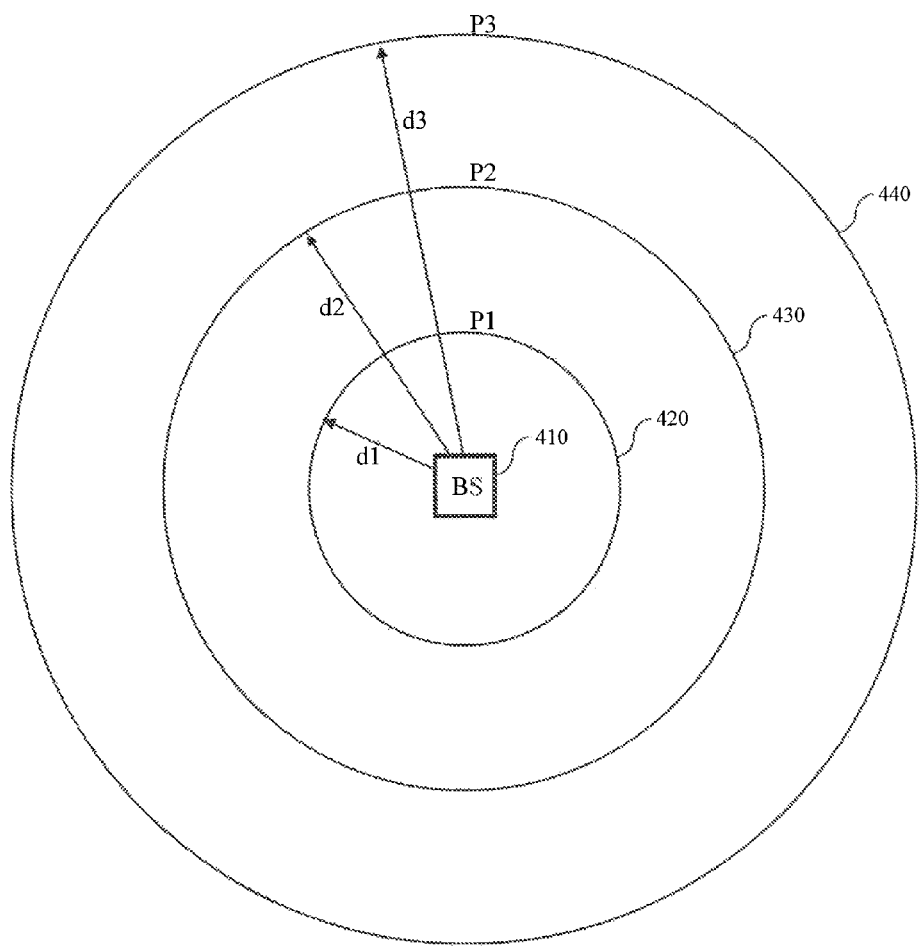
FIG. 4 illustrates a diagram of a transmission power of a wireless communication device according to an exemplary embodiment of the invention.

FIG. 4 illustrates a diagram of a transmission power of a wireless communication device according to an exemplary embodiment of the invention. FIG. 4 shows a base station 410 having an initial transmission power $P_T$. Transmissions from the base station 410 travel radially outward and diminish in power the further they travel. Accordingly, at a distance d1, the receive power of a signal transmitted from the base station 410 is P1<$P_T$. Similarly, at further distances d3 and d2, the receive power of the signal transmitted from the base station 410 is P3<P2<P1<$P_T$. As such, the receive power of a signal transmitted from the base station 410 is inversely proportional to the distance from the base station 410, such that:

$$P_R = \frac{1}{f(d)} \cdot P_T, \quad (1)$$

where $P_R$ is the receive power of the signal, $P_T$ is the transmit power of the signal, and f(d) is a function of the distance between the receive location and the transmitting base station.

Using the relationship described in equation (1), the distance from a UE to the base station 410 can be estimated based on the power of a signal received by the UE from the base station 410, provided that the transmission power $P_T$ is known. Therefore, if the UE reports receiving the signal with power P1, the distance between the UE and the base station 410 is estimated to be d1. Consequently, the UE can be located anywhere on ring 420. Similarly, if the UE reports power P2, the UE can be located anywhere on ring 430, and if the UE reports power P3, the UE can be located anywhere on ring 440.

When the UE reports measurement information of multiple base stations, its position can be accurately estimated by determining where the distance rings of each of the measured base stations intersect, discussed below.

Returning to the example of FIG. 3, the current base station 200 is attempting to estimate the location of the UE. The current base station receives measurement information relating to base stations 310 and 320, which includes a received signal power for each. From the received signal powers, and using the above equation (1), the handoff decision module 240 determines distance rings that depict the UE's distances from the respective base stations. Specifically, the handoff decision module 240 retrieves stored transmission powers for each of the base stations 310 and 320 from the memory module 230. The handoff decision module 240 then calculates a distance ring 315 that depicts the UE's possible location with respect to base station 310, and a distance ring 325 that depicts the UE's possible location with respect to base station 320, based on the stored transmission powers. In addition, the handoff decision module 240 calculates a distance ring 335 that depicts the UE's possible locations with respect to the current base station 200, which can be based on current measurement information or stored information relating to the current base station 200.

Once all the distance rings have been calculated, the handoff decision module 240 retrieves stored locations of the base stations 310 and 320 and maps the distance rings based on the stored locations. Once mapped, the handoff decision module 240 determines a point of common intersection between all the distance rings (or near intersection), and estimates the resulting estimated position (EP) as the position of the UE.

2. Handoff Decision

Once the handoff decision module 240 has estimated the location of the UE, the handoff decision module 240 determines whether to initiate a handoff. The hand-off decision module 240 retrieves from the memory module 230 relevant information relating to all nearby base stations (including both intra- and inter-frequency base stations). The retrieved information may include base station locations, communication capabilities, and communication ranges, among others. The handoff decision module 240 then determines whether to initiate a handoff based on any acceptable criteria.

For example, based on the estimated position EP of the UE, the handoff decision module 240 may initiate a handoff to a base station nearest to the UE, or one that has the highest expected receive power. The handoff decision module 240 may also prioritize the current base station or intra-frequency base stations when the benefits associated with handing off to an inter-frequency base station are negligible, such as, for example, when the inter-frequency base station's receive power exceeds the receive power of an intra-frequency base station by less than a predetermined threshold. Many other decision-making criteria are available based on the estimate location of the UE within the spirit and scope of the present invention.

Once the handoff decision module 240 has made a determination as to whether the UE should perform a handoff, the handoff decision module 240 reports the decision to the controller module 220. If the handoff decision module 240 has determined that a handoff should be initiated, the controller module 220 generates a handoff instruction, and transmits the handoff instruction to the UE via the radio module 210 and antenna 201.

In this manner, the current base station is able to determine whether a handoff should be performed without requiring the UE to measure all nearby base stations. As a result, the processing required by the UE is minimized and the communication time between the UE and the current base station 200 is maximized.

Those skilled in the relevant art(s) will recognize that many modifications are available to the base station 200 within the spirit and scope of the present invention. For example, although the above discussion has been made with respect to a base station, it should be understood that the same or similar process could be performed by a UE. In addition, the handoff decision module 240 could be modified with some self-adaptation protocol in order to train itself to make handoff decisions to cells that have not been measured based on the intra-frequency measurements of the UE. Such self-adaptation protocol may be performed by a neural network or other machine learning-based method.

Exemplary Device Configuration for Efficiently Handing Off

Once the handoff has been initiated, the wireless communication device 200 (UE) takes many measures to reduce handoff latency, which are discussed in detail below. It will be recognized that each of these configurations can be implemented independently of the others, as the application may require. As such, each of the configurations may be implemented alone, or together with any of the other configurations.

Withhold Acknowledgement

During communication with another wireless communication device (such as a base station), typical wireless communication devices generate and transmit acknowledgement signals indicating that various information or instructions have been successfully received. However, the generation and transmission of these acknowledgement signals consumes precious time that could be used to begin the handoff procedure.

As such, upon receipt of a handoff instruction, the wireless communication device 200 immediately initiates the handoff procedure without sending the acknowledgement signal. Specifically, once the controller module 220 identifies a received signal as a handoff instructions, the controller module 220 immediately stops any generation of an acknowledgement signal in the controller module 220, and controls the radio module 210 to end transmission of any acknowledgement signals in the process of being sent. These acknowledgements can include any acknowledgement of data or instruction signals received by the wireless communication device 200. The controller module 220 then initiates the handoff without generating any additional acknowledgement signals for the current base station.

In this manner, the wireless communication device 200 can capture the acknowledgement time, and instead utilize this time for handing off to the new base station. As such, handoff latency can be reduced.

Estimate SFN

Before handing off to a new base station, typical wireless communication devices must first acquire a system frame number (SFN) from the new base station in order to sync communications with the target (new) base station. However, the SFN is included within a MIB (Master Information Block) signal broadcast from the target base station once every 10 ms. Consequently, waiting for the SFN can add up to 10 ms of handoff latency.

Consequently, the wireless communication device 200 attempts to determine the SFN from the measured time offset. As discussed above, when measuring a target base station, the controller module 220 causes relevant information to be stored in the memory module 230. Such information may include a frame start time (FST) associated with the target base station. The FST essentially indicates the starting point of uplink or downlink sub-frames to be transmitted to, or received from, the target base station.

Upon initiating the handoff, the controller module 220 retrieves the FST of the target base station ($FST_T$). In addition, the controller module 220 knows the FST of the serving (current) base station, $FST_S$. From this information, the controller module 220 calculates an updated target frame start time $FST_{TU}$ by determining a value closest to the $FST_S$ from among $[FST_T-10\text{ ms}, FST_T, FST_T+10\text{ ms}]$.

Once the updated value $FST_{TU}$ has been determined, the controller module 220 determines whether a difference between the $FST_{TU}$ and $FST_S$ falls below a predetermined threshold $T_{TH}$. As an example, because the wireless communication device 200 should assume that the FSTs of the target and serving base stations are no more than 5 ms apart, the threshold $T_{TH}$ might be set to 4.5 ms. The controller module 220 then determines the inequality:

$$|FST_S - FST_{TU}| \leq T_{TH}. \quad (2)$$

If the controller module 220 determines the inequality (2) to be satisfied, the controller module initiates the handoff assuming that the SFN of the target base station starting at $FST_{TU}$ is the same as the serving base station SFN.

If, on the other hand, the controller module 220 determines the inequality (2) not to be satisfied, the controller module 220 waits to initiate the handoff until it has received the actual SFN from the broadcast MIB signal.

In this manner, the wireless communication device can potentially reduce handoff latency by up to 10 ms that it otherwise would have waited to receive the MIB signal of the target base station. In addition, in order to further streamline this process, and avoid adding undue delay, the controller module 220 can continue to monitor signals received by the radio module 210 to determine if the MIB signal has been received during the calculation period. If the MIB signal is received, the controller module 220 can cancel the SFN calculation, and instead extract and use the SFN contained in the received MIB signal.

Initiate Random Access Procedure Using Measured Time Offset

Once a useable SFN has been obtained, the wireless communication device must next initiate a random access procedure. The random access procedure is the procedure implemented by a wireless communication device to begin communicating with the target base station. Because the wireless communication device and the target base station are not synchronized, a typical wireless communication device must wait to receive a time offset from the target base station, which allows the wireless communication device to determine when the random access channel (RACH) is available for the procedure. However, as with the SFN, the time offset is also included the MIB signal broadcast from the target base station only once every 10 ms. While waiting for the MIB signal, the typical wireless communication device potentially misses several opportunities to begin the random access procedure.

Consequently, rather than wait for the time offset, the wireless communication device 200 estimates the time offset based on earlier measurements. For example, the time offset can be determined by monitoring the start and/or end of frames transmitted by the target base station during previous measurements. Thus, during measurement, the controller module 220 detects the beginnings and/or ends of frames from the target base station based on any acceptable criteria, such as signal strengths, decoded control information, etc. From this information, the controller module 220 estimates a time offset associated with the target base station and stores the time offset in the memory module 230.

Once the handoff has been initiated, the controller module 220 simply retrieves the estimated time offset from the memory module 230. The controller module 220 then causes the radio module 210 to transmit information on the RACH using the estimated time offset in order to initiate the random access procedure. The time offset is only an estimate, and therefore is not likely to be exactly correct. However, base stations include a large guard band between the start of the RACH and the adjacent communication band. Consequently, even though the time offset is not correct, it will be sufficient for the random access procedure provided that it is sufficiently accurate (i.e., causes the random access preamble to be received at the target base station during or shortly after the time period associated with the guard band).

Figure 5:
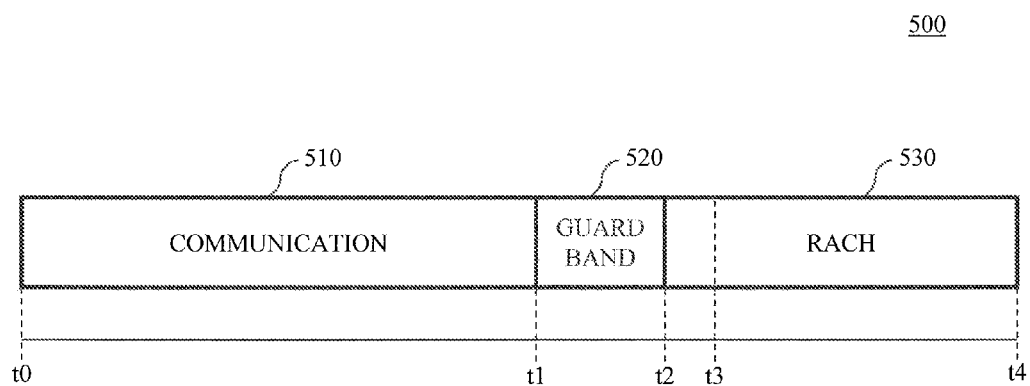
FIG. 5 illustrates a block diagram of an exemplary communication timing band that may be used by a base station according to an exemplary embodiment of the invention.

FIG. 5 illustrates a block diagram of an exemplary communication timing band 500 that may be used by a base station according to an exemplary embodiment of the invention.

The communication timing band 500 includes a communication band 510 (time t0 to t1) and a RACH band 530 (time t2 to t4) that are separated by a guard band 520 (time t1 to t2). Wireless communication standards typically require the start of the random access signal to be received by the start of the RACH band 530. However, it is important to avoid transmitting the random access signal during the communication band 510 so as to avoid interference. Consequently, provided that the stored time offset is sufficiently accurate so as to cause the random access signal to be received within the guard band 520 (time t1 to t2), or during some beginning portion of the RACH band 530 (time t2 to t3), the random access signal will be properly received and the time offset will be considered useable.

In order to determine the accuracy of the stored time offset, and thereby determine its usability, the controller module 220 may examine numerous factors, as discussed below.

For example, when the controller module 220 stores the time offset in the memory module 230 during measurement, the controller module 220 may also store in the memory module 230 a timestamp associated with the time offset. The timestamp indicates the time at which the time offset was stored in memory. When determining whether to initiate the random access procedure using the stored time offset, the controller module 220 also retrieves the timestamp associated with the time offset. The controller module 220 then determines whether the time offset is usable by comparing the timestamp to a predetermined threshold value.

If the timestamp is greater than the threshold value (i.e., the time offset is older than a predetermined length of time), the controller module 220 determines that the time offset retrieved from the memory module 230 is not useable for initiating the random access procedure, and instead waits to receive an actual time offset from the target base station. Alternatively, if the controller module 220 determines that the timestamp is less than the threshold value (i.e., the time offset is not older than the predetermined length of time), the controller module 220 determines that the time offset retrieved from the memory module 230 is useable, and initiates the random access procedure based on the stored time offset.

Conditions, such as channel conditions, movement of the wireless communication device 200, etc., change over time. Therefore, the time offset is presumed to be less accurate as time passes. Consequently, by setting a threshold time to be a time period that provides a sufficient probability of accuracy, the usability of the stored time offset can be quickly determined by comparing its timestamp to the predetermined threshold. Many additional, or alternative, factors may be examined by the controller module 220 to determine whether the stored time offset is useable for initiating the random access procedure.

An Exemplary Device Configuration for Handling a Failed Handoff Attempt

When typical wireless communication devices attempt to perform a handoff to a target base station, they break connection with the current base station. Consequently, if the handoff attempt fails, the wireless communication device must perform a full search for a new base station, requiring monitoring the wireless communication environment, measuring the nearby base stations, and re-initiating communication procedures. This process is extremely time-consuming.

Consequently, when the wireless communication device 200 receives a handoff instruction, the controller module 220 stores communication information relating to the current base station in the memory module 230. This information may include the time offset, SFN and modulation scheme currently employed between the wireless communication device 200 and the current base station, among others as are necessary to maintain communication with the current base station. Once the information has been stored in the memory module 230, the controller module 220 breaks communication with the current base station and initiates the handoff.

If the handoff fails, the controller module 220 does not immediately perform a full search and measurement for other possible base stations. Instead, the controller module 220 retrieves the communication information relating to the current (previous) base station that was stored in the memory module 230 prior to initiating the handoff. Using this information, the controller module 220 reestablishes communication with the current base station. This reconnection can be performed immediately using the stored information, without having to perform a formal communication establishment.

Once reconnected to the current base station, the controller module 220 then begins measuring and monitoring nearby base stations in accordance with the discussions above.

With this configuration, the wireless communication device 200 is able to significantly reduce "dead time" where it is not connected to any serving base station. Further, although the current base station may be providing poor service (as evidenced by the handoff attempt), by returning to the base station, the wireless communication device 200 nonetheless can remain connected. In this manner, the wireless communication device 200 is able to maintain at least some communication while seeking out a new candidate for handoff.

An Exemplary Configuration for Searching for a Preferred PLMN

Although wireless communication devices can generally connect to any acceptable base station, those wireless communication devices are generally required to seek out base stations having their preferred PLMN (Public Land Mobile Network). For example, a device programmed for AT&T® may connect with a Verizon® base station, but should continue to seek out a base station having an AT&T PLMN while connected to the Verizon base station.

Typical wireless communication devices search all frequency bands, and all frequencies within those bands, until the preferred PLMN is found. However, the search begins at an essentially random point, and does not give any priority to specific bands/frequencies that are likely to include the preferred PLMN. Therefore, in the wireless communication device 200, the search for the preferred PLMN is organized, and bands/frequencies are prioritized to increase the likelihood of finding the preferred PLMN early in the search.

As discussed above, the controller module 220 repeatedly measures nearby base stations. During the measurement process, the controller module 220 may identify various base stations as having the preferred PLMN. In addition, during communication, the wireless communication device 200 may handoff to several different base stations, some of which also have the preferred PLMN. The controller module 220 stores a frequency band and a frequency associated with each base station having the preferred PLMN in the memory module 230. This information can be stored along with a timestamp, and erased from the memory module 230 once the information reaches a certain age to ensure the list of nearby base stations having the preferred PLMN stays accurate.

At device startup, or after handing off to a base station that does not support the preferred PLMN, the controller module 220 initiates the PLMN search. The controller module 220 retrieves the band/frequency information stored in the memory module 230. The controller module 220 then starts a prioritized search of the frequency spectrum based on the retrieved information.

Specifically, the controller module 220 selects a frequency band from among the stored frequency bands that have been prior identified to include a preferred PLMN. The frequency band may be selected in order of most recent to oldest, or in any other acceptable way within the spirit and scope of the invention. Once selected, the controller selects a stored frequency within the frequency band in a similar manner. The controller module 220 then tunes the radio module 210 to the selected frequency. Once the radio module 210 has been tuned, the controller module 220 identifies all detectable cells within the frequency and stores information relating to the identified cells in the memory module 230. This information may include time offset and frame boundaries, among other information.

Once the information has been stored in the memory module 230, the controller module 220 identifies the strongest cell from among the detected cells. The controller module 220 then acquires the SIB (System Information Block) signal from the strongest cell, which contains a listing of supported PLMNs. From this signal, the controller module 220 determines whether the preferred PLMN is supported by the strongest cell. If the preferred PLMN is supported, the controller module 220 may then choose to initiate a handoff to this cell. If the preferred PLMN is not supported, the controller module 220 then repeats the procedure for each strongest remaining cell within the frequency until the preferred PLMN is found.

If the preferred PLMN is not found in the selected frequency, the controller module 220 then repeats the procedure for each remaining stored frequency within the selected frequency band, and then for each remaining frequency within the selected frequency band until the preferred PLMN is found. If the preferred PLMN is not found within the selected frequency band, the controller module 220 then repeats the procedure for each remaining stored frequency band, and then for each remaining frequency band within the frequency spectrum until the preferred PLMN is found.

By prioritizing frequencies known to include the preferred PLMN, the controller module 220 is able to significantly reduce the time spent searching for the PLMN by increasing the likelihood of locating the preferred PLMN early in the search.

Those skilled in the relevant art(s) will recognize that many modifications are available to the above configuration within the spirit and scope of the invention. For example, rather than searching all non-stored frequencies within the selected frequency band, once the controller module 220 has finished searching all stored frequencies within the selected frequency band, the controller module 220 can then move to another stored frequency band. The controller module 220 can then search non-stored frequencies once the search of the stored frequencies has concluded without success.

An Exemplary Method for Determining Whether to Initiate a Handoff

Figure 6:
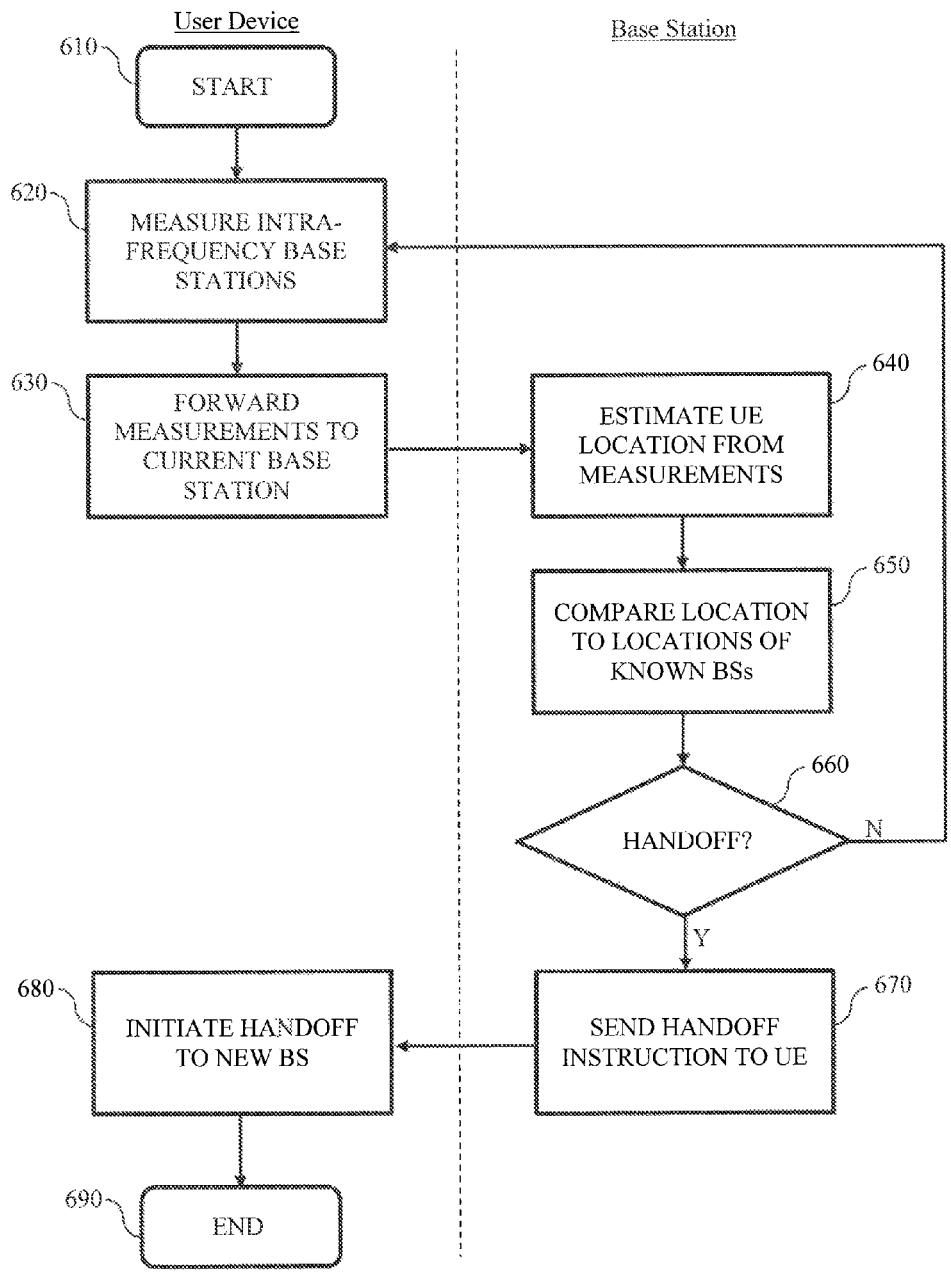
FIG. 6 illustrates a block diagram of a method for determining and initiating a handoff from a current base station to a new base station according to an exemplary embodiment of the present invention.

FIG. 6 illustrates a block diagram of a method for determining and initiating a handoff of a user device from a current base station to a new base station according to an exemplary embodiment of the present invention.

The method begins at step 610 and immediately proceeds to step 620. In step 620, the user device measures only intra-frequency base stations. The method then proceeds to step 630. In step 630, the user device forwards the measurements of the intra-frequency base stations to the current base station. The method then proceeds to step 640.

In step 640, the current base station estimates the location of the user device from the received intra-frequency measurements. The location can be determined by estimating the distance of the user device from each of the measured base stations based on receive powers of signals received from those base stations. Once the location of the user device has been estimated, the method proceeds to step 650. In step 650, the current base station compares the estimated location of the user device to known locations of other base stations. The method then proceeds to step 660.

In step 660, based on the locations of the user device and the known base stations, the current base station makes a determination as to whether the user device should handoff to one of the known base stations. If the current base station determines that a handoff is not needed, the method returns to step 620 to repeat the determination process. Alternatively, if the current base station determines that a handoff is needed, the method proceeds to step 670.

In step 670, the current base station transmits a handoff instruction to the user device. The method then proceeds to step 680. In step 680, the user device receives the handoff instruction and initiates a handoff to a target base station designated by the current base station. The method then proceeds to step 690, where the method ends.

Those skilled in the relevant art(s) will recognize that the method can additionally or alternatively include any of the functionality of the wireless communication device 200 discussed above, and the above description of the exemplary method should neither be construed to limit the method nor the description of the wireless communication device 200.

An Exemplary Method for Performing a Handoff

Figure 7:
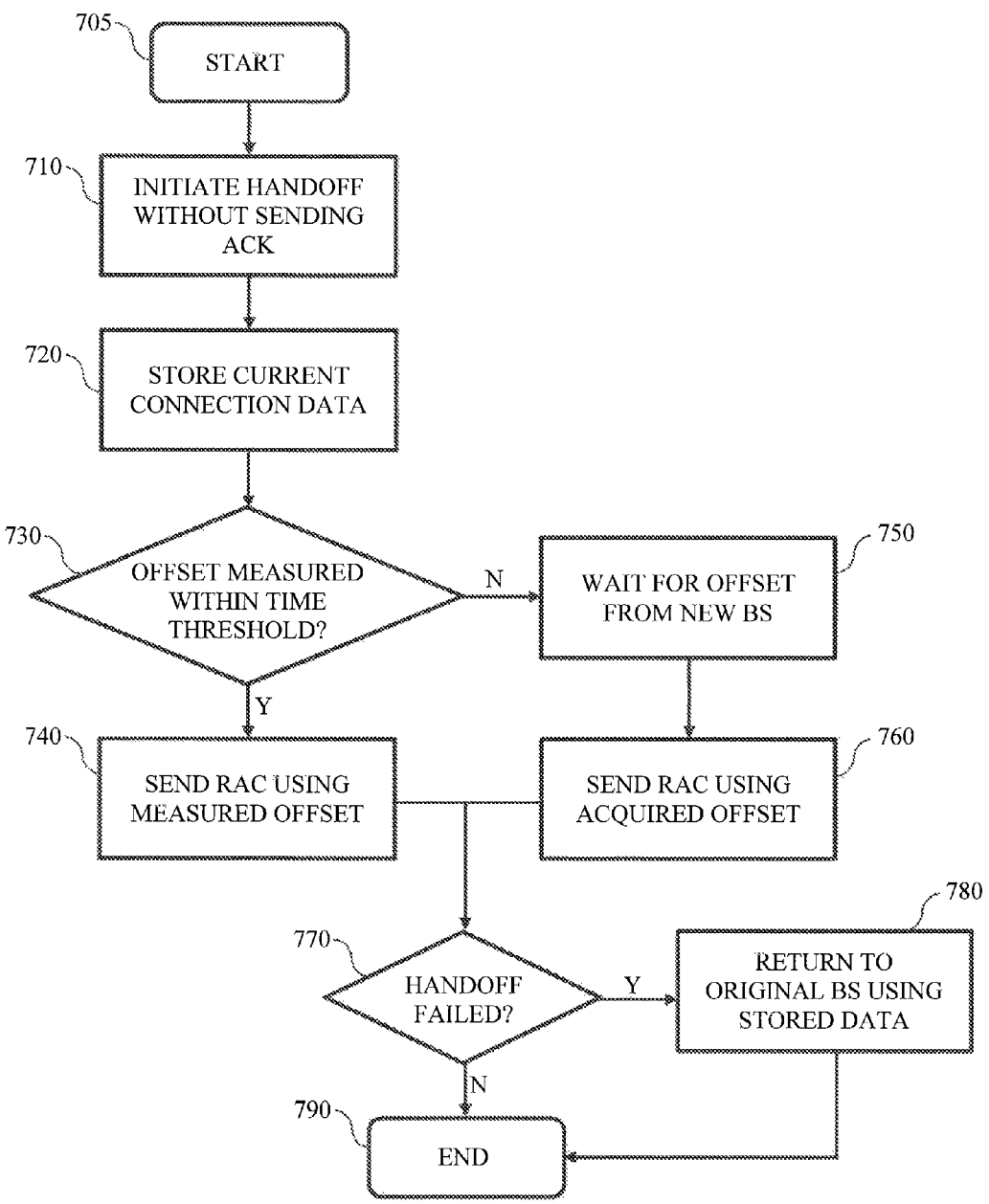
FIG. 7 illustrates a block diagram of a method for handing off to a new base station that may be implemented by the wireless communication device according to an exemplary embodiment.

FIG. 7 illustrates a block diagram of a method for handing off to a target base station that may be implemented by a wireless communication device according to an exemplary embodiment.

The method begins at step 705 and immediately proceeds to step 710. In step 710, the device initiates the handoff immediately upon receiving the handoff instruction without sending any handoff acknowledgement signal, or any data acknowledgement signal. The method then proceeds to step 720. In step 720, the device stores connection data relating to its connection with the current base station, which may include time offset, modulation scheme, and communication allocations, among others. The method then proceeds to step 730.

In step 730, the device determines whether a measured time offset was measured within a predetermined time. In other words, the device determines the age of the time offset as an indication of its accuracy. The time offset can be measured by the device during pre-handoff measurements by monitoring frame boundaries of the target base station. If the time offset was measured within the predetermined time, the method proceeds to step 740. In step 740, the device performs a random access procedure with the target base station using the measured time offset.

If, on the other hand, the time offset was measured outside the predetermined time, the method proceeds to step 750. In step 750, the device waits to receive the actual time offset from the target base station. Once received, the method proceeds to step 760. In step 760, the device performs the random access procedure using the time offset acquired from the target base station.

After the random access procedure has been initiated, the method proceeds to step 770. In step 770, the device determines whether the handoff was failed for any of a variety of reasons. If the device determines that the handoff has failed, the method proceeds to step 780. In step 780, the device reestablishes communication with the original base station using the communication information stored at step 720, and then proceeds to step 790, where the method ends. Alternatively, if the device determines that the handoff has succeeded, the method proceeds directly to step 790, where the method ends.

Those skilled in the relevant art(s) will recognize that the method can additionally or alternatively include any of the functionality of the wireless communication device 200 discussed above, and the above description of the exemplary method should neither be construed to limit the method nor the description of the wireless communication device 200.

An Exemplary Method for Searching for a Preferred PLMN

FIGS. 8A-8C illustrate block diagrams that collectively show a method of searching for a preferred PLMN that may be implemented by the wireless communication device according to an exemplary embodiment of the present invention. The method described herein assumes that the wireless communication device has stored one or more frequency bands, and corresponding frequencies, that were found to contain cells supporting the preferred PLMN, as discussed above in the corresponding description of the wireless communication device 200.

Traversing Frequency Bands Within the Frequency Spectrum

FIG. 5A specifically illustrates a block diagram of a method for scanning frequency bands as part of the larger method of searching for a preferred PLMN that may be implemented by the wireless communication device according to an exemplary embodiment of the present invention.

The method begins at step 802 and immediately proceeds to step 804. In step 804, the device scans a stored band (described in FIG. 8B). The stored band may be chosen from among a plurality of stored bands based on most frequent/recent use, or using any other criteria within the spirit and scope of the invention. The method then proceeds to step 806. In step 806, the device determines whether the preferred PLMN was found in the stored band. If the preferred PLMN was found, the method proceeds to step 816, where the method ends. Alternatively, if the preferred FINN was not found, the method proceeds to step 808. In step 808, the device determines whether any remaining bands are stored. If additional bands are stored, the method returns to step 804. The device cycles through this procedure for each stored band until a cell supporting the preferred PLMN is found.

If, at step 808, it is determined that no stored bands remain (the preferred PLMN is not found in the stored bands), the method then proceeds to step 810. In step 810, the device scans a strongest remaining (unstored) frequency band within the frequency spectrum (described in FIG. 8B). The method then proceeds to step 812. In step 812, the device determines whether the preferred PLMN was found in the band. If the preferred PLMN was found, the method proceeds to step 816, where the method ends. Alternatively, if the preferred PLMN was not found, the method proceeds to step 814. In step 814, the device determines whether any bands remain in the frequency spectrum. If frequency bands remain, the method returns to step 810 to scan a strongest remaining frequency band. The method cycles through this procedure for each remaining band until a cell supporting the preferred PLMN is found.

If, at step 814, it is determined that no bands remain within the frequency spectrum (the preferred PLMN was not found in any of the frequency bands), the method returns to step 804 to again start the scanning procedure.

Traversing Frequencies Within a Selected Frequency Band

FIG. 8B specifically illustrates a block diagram of a method for scanning frequencies within a frequency band as part of the larger method of searching for a preferred PLMN that may be implemented by the wireless communication device according to an exemplary embodiment of the present invention.

1. For a Stored Frequency Band (From Step 804)

The method begins at step 820, where the device decides to scan a stored band, and immediately proceeds to step 822. In step 822, the device scans a stored frequency (described in FIG. 8C) associated with the stored frequency band. The stored frequency may be chosen from among a plurality of stored frequencies based on most frequent/recent use, or using any other criteria within the spirit and scope of the invention. The method then proceeds to step 824. In step 824, the device determines whether the preferred PLMN was found in the stored frequency. If the preferred PLMN was found, the method proceeds to step 834, where the method returns a "Preferred PLMN Found" response to step 806 of FIG. 8A. Alternatively, if the preferred PLMN was not found, the method proceeds to step 826. In step 826, the device determines whether any remaining frequencies are stored associated with the selected band. If additional frequencies are stored, the method returns to step 822. The device cycles through this procedure for each stored frequency of the selected band until a cell supporting the preferred PLMN is found.

If, at step 826, it is determined that no stored frequencies remain within the selected band (the preferred PLMN was not found in any of the stored frequencies within the selected frequency band), the method then proceeds to step 828. In step 828, the device scans a strongest remaining frequency within the selected frequency band (described in FIG. 8C). The method then proceeds to step 830. In step 830, the device determines whether the preferred PLMN was found in the band. If the preferred PLMN was found, the method proceeds to step 834, where the method returns a "Preferred PLMN Found" to step 806 of FIG. 8A. Alternatively, if the preferred PLMN was not found, the method proceeds to step 832. In step 832, the device determines whether any frequencies remain within the selected band. If frequencies remain, the method returns to step 828 to scan a strongest remaining frequency within the selected band. The method cycles through this procedure for each remaining frequency within the selected band until a cell supporting the preferred PLMN is found.

If, at step 832, it is determined that no frequencies remain within the selected frequency band (the preferred PLMN was not found within the selected frequency band), the method returns a "Preferred PLMN Not Found" to step 806 of FIG. 8A.

2. For a Non-Stored Frequency Band (From Step 810 of FIG. 8A)

When the device is scanning a non-stored frequency band, there presumably are no stored frequencies within that band. Consequently, the method begins at step 840, and immediately proceeds to step 828. The device cycles through steps 828-832 for each frequency within the non-stored frequency band, as discussed above. If the preferred PLMN is found, the method proceeds to step 834 and issues a "Preferred PLMN Found" response to step 812 of FIG. 8A. Alternatively, if the preferred PLMN is not found, the method proceeds to step 834 and issues a "Preferred PLMN Not Found" response to step 812 of FIG. 8A.

Traversing Cells Within a Selected Frequency

FIG. 8C specifically illustrates a block diagram of a method for scanning cells within a frequency as part of the larger method of searching for a preferred PLMN that may be implemented by the wireless communication device according to an exemplary embodiment of the present invention.

Regardless of whether the frequency is stored or non-stored, the method for scanning cells within the frequency can be implemented the same. Therefore, once the device has selected a frequency to scan (steps 822 or 828 of FIG. 8B), the method begins at step 850 and immediately proceeds to step 852. In step 852, the device identifies all detectable cells within the selected frequency. The method then proceeds to step 854. In step 854, the device stores physical information relating to each of the identified cells, which may include time offset, frame boundaries, etc. The method then proceeds to step 856.

In step 856, the device receives the SIB (System Information Block) signal from the strongest cell. As discussed above, the SIB signal contains a listing of PLMNs supported by the cell. The method then proceeds to step 858. In step 858, the device analyzes the SIB signal to determine if the selected cell supports the preferred PLMN. If the preferred PLMN is supported, the method proceeds to step 862 and returns a "Preferred PLMN Found" response to step 824 or 830 (depending on if the scan began at step 822 or 828, respectively) of FIG. 8B. Alternatively, if the preferred PLMN is not found within the selected cell, the method proceeds to step 860.

In step 860, the device determines whether any cells remain within the selected frequency. If cells remain, the method returns to step 856 to receive a SIB signal from the strongest remaining cell within the selected frequency. The devices cycles through this procedure until all identified cells within the selected frequency are scanned for preferred PLMN support. If, at step 860, it is determined that no cells remain within the selected frequency, the method proceeds to step 862 and responds with a "Preferred PLMN Not Found" response to step 824 or 830 of FIG. 8B.

Those skilled in the relevant art(s) will recognize that the method described above with respect to FIGS. 8A-8C can additionally or alternatively include any of the functionality of the wireless communication device 200 discussed above, and the above description of the exemplary method should neither be construed to limit the method nor the description of the wireless communication device 200.

CONCLUSION

It is to be appreciated that the Detailed Description section, and not the Abstract section, is intended to be used to interpret the claims. The Abstract section may set forth one or more, but not all exemplary embodiments, of the invention, and thus, are not intended to limit the invention and the appended claims in any way.

The invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the following claims and their equivalents.

What is claimed is:

1. A wireless communication device, comprising:
a memory module that stores information of nearby base stations, the nearby base stations including both intra-frequency and inter-frequency base stations; and
a handoff decision module configured to receive measurement data of an intra-frequency base station, and to determine whether a handoff should be initiated to one of the nearby base stations based only on the measurement data and the stored information,
wherein the stored information includes locations and transmit powers of the nearby base stations,
wherein the measurement data is received from an external device and includes receive powers of a plurality of measured base stations, and
wherein the handoff decision module is configured to determine an estimated location of the external device based on the receive powers of the plurality of measured base stations.

2. The wireless communication device of claim 1,
wherein the received measurement data includes a receive power of a signal received from the intra-frequency base station.

3. The wireless communication device of claim 2,
wherein the handoff decision module is configured to receive connection data of a connection between the wireless communication device and the external device, and
wherein the handoff decision module is configured to calculate the estimated location of the external device based on the measurement data and the connection data.

4. The wireless communication device of claim 3, wherein the handoff decision module is configured to determine whether the handoff should be initiated, by comparing the estimated location to stored locations of the nearby base stations and to a location of the wireless communication device.

5. The wireless communication device of claim 4, wherein the estimated location of the external device is determined based on signal qualities of the plurality of base stations.

6. The wireless communication device of claim 1, wherein the handoff decision module is configured to be self-adapting, and to determine to handoff to a base station that has not been measured.

7. A wireless communication device, comprising:
a controller module configured to perform a measurement of a target base station and to estimate a time offset of the target base station during the measurement; and
a memory module that stores the time offset,
wherein the controller module is configured to determine, after receiving handoff instruction, whether the stored time offset is useable to initiate a handoff to the target base station based on an age of the stored time offset, and
wherein in the event that the age of the stored time offset exceeds a predetermined threshold, the controller module is configured to acquire an actual time offset from the target base station and initiate the handoff using the acquired time offset.

8. The wireless communication device of claim 7, wherein the controller module is configured to store a timestamp in the memory module associated with the stored time offset,
wherein the controller module is configured to determine whether the stored time offset is useable by comparing the age of the stored time offset to the predetermined threshold, the age being determined from the stored timestamp, and
wherein in the event that the age of the stored time offset is below the predetermined threshold, the controller module is configured to initiate the handoff using the stored time offset.

9. The wireless communication device of claim 7, wherein the controller module is configured to estimate the time offset of the target base station by detecting a frame boundary of a signal received from the target base station.

10. The wireless communication device of claim 7, wherein the controller module is configured to receive the handoff instruction, and
wherein the controller module is configured to store connection data relating to a current connection between the wireless communication device and a current base station in the memory module.

11. The wireless communication device of claim 10, wherein the controller module is configured to initiate the handoff based on the handoff instruction,
wherein the controller module is configured to determine whether the handoff failed, and
wherein in the event that it is determined that the handoff has failed, the controller module is configured to reestablish communication with the current base station using the stored connection data.

12. A wireless communication device, comprising:
a controller module configured to perform a measurement of a target base station and to estimate a time offset of the target base station during the measurement; and
a memory module that stores the time offset,
wherein the controller module is configured to determine, after receiving a handoff instruction, whether the stored time offset is useable to initiate a handoff to the target base station based on an age of the stored time offset,
wherein the controller module is configured to receive the handoff instruction, and
wherein the controller module is configured to cancel all pending acknowledgement signals after receiving the handoff instruction.

13. A wireless communication device within a wireless communication environment, the wireless communication device comprising:
a radio module configured to communicate in a plurality of frequency bands, the plurality of frequency bands including at least one supported frequency band that supported a preferred Public Land Mobile Network (PLMN) of the wireless communication device and a non-supported frequency band that did not support the preferred PLMN;
a memory module configured to store the at least one supported frequency band from among the plurality of frequency bands, and a frequency within the corresponding at least one supported frequency band in which there previously existed a cell that supported the preferred PLMN of the wireless communication device; and
a controller module configured to first tune the radio module to each of the at least one stored supported frequency bands until it detects a stored supported frequency band that supports the preferred PLMN, and second tune to at least one frequency band that is not stored when the controller module determines that none of the at least one stored supported frequency bands support the preferred PLMN,
wherein the controller module is configured to determine whether the first stored supported frequency band supports the preferred PLMN by analyzing all identifiable cells within a stored frequency of the first stored frequency band, and
wherein in the event that the controller module determines that no cell within the stored frequency supports the preferred PLMN, the controller module is configured to tune the radio module to a non-stored frequency within the first stored frequency band, and to detect whether a cell within the non-stored frequency supports the preferred PLMN.

14. The wireless communication device of claim 13, wherein the controller module is configured to determine whether the first stored supported frequency band supports the preferred PLMN by analyzing all identifiable cells within a first stored frequency of the first stored frequency band, and
in the event that the controller module determines that no cell within the first stored frequency supports the preferred PLMN, the controller module is configured to tune the radio module to a second stored frequency within the first stored frequency band, and to detect whether a cell within the second stored frequency supports the preferred PLMN.

15. The wireless communication device of claim 13, wherein in the event that the controller module determines that the first stored supported frequency band does not support the preferred PLMN, the controller module is configured to tune the radio module to a second stored supported frequency band from among the at least one supported frequency band, and to detect whether the second stored supported frequency band supports the preferred PLMN.

16. The wireless communication device of claim 13, wherein in the event that the controller module determines that the first stored supported frequency band does not support the preferred PLMN, the controller module is configured to tune the radio module to a non-stored frequency band, and to detect whether the non-stored frequency band supports the preferred PLMN.

* * * * *

UNITED STATES PATENT AND TRADEMARK OFFICE
CERTIFICATE OF CORRECTION

PATENT NO. : 8,938,239 B2  
APPLICATION NO. : 13/340384  
DATED : January 20, 2015  
INVENTOR(S) : Kherani et al.

Page 1 of 1

It is certified that error appears in the above-identified patent and that said Letters Patent is hereby corrected as shown below:

In the Claims

Column 18, line 39, please replace "receiving handoff" with --receiving a handoff--.

Signed and Sealed this
Twenty-eighth Day of April, 2015

Michelle K. Lee
*Director of the United States Patent and Trademark Office*